United States Patent

Betzl et al.

[11] 4,281,297
[45] Jul. 28, 1981

[54] ELECTRICAL FILTER CIRCUIT UTILIZING CHARGE TRANSFER DELAY LINES UTILIZING INDIVIDUAL CHARGE TRANSFER DELAY ELEMENTS

[75] Inventors: Hermann Betzl; Ernst Hebenstreit, both of Munich; Roland Schreiber, Ottobrunn-Riemerling, all of Fed. Rep. of Germany

[73] Assignee: Siemens Aktiengesellschaft, Berlin & Munich, Fed. Rep. of Germany

[21] Appl. No.: 60,195

[22] Filed: Jul. 24, 1979

[30] Foreign Application Priority Data

Jul. 26, 1978 [DE] Fed. Rep. of Germany ....... 2832849

[51] Int. Cl.³ .................... H03H 17/02; G11C 27/00
[52] U.S. Cl. ................................ 333/165; 333/173
[58] Field of Search ................................ 333/165, 173

[56] References Cited

FOREIGN PATENT DOCUMENTS 2608582  8/1977  Fed. Rep. of Germany ........... 333/165

Primary Examiner—Eli Lieberman
Attorney, Agent, or Firm—Hill, Van Santen, Steadman, Chiara & Simpson

[57] ABSTRACT

A filter circuit utilizing charge transfer delay lines having individual CTD elements utilizing four-terminal resonators each of which is designated as a self-contained closed looped circuit and which determine the frequency dependent transmission characteristics of the filter circuit and wherein successive four-terminal resonators are interconnected by way of a coupling circuit. The invention utilizes the coupling circuit mounted between adjacent four-terminal resonators which are constructed simply as possible and utilizing integrated circuit techniques. Amplifiers are connected in parallel with the input and/or the output of the individual four-terminal resonators and the signal flow direction of the amplifiers corresponds to that of parallel connected CTD lines and the series lines of the coupling circuit and the amplifiers have unidirectional transmission characteristics and an inverting amplifier is contained in at least one of the series lines.

3 Claims, 4 Drawing Figures

ELECTRICAL FILTER CIRCUIT UTILIZING CHARGE TRANSFER DELAY LINES UTILIZING INDIVIDUAL CHARGE TRANSFER DELAY ELEMENTS

BACKGROUND OF THE INVENTION

1. Field of the Invention

The invention relates to electrical filter circuits utilizing charge transfer devices comprising individual charge transfer device elements wherein four-terminal quadripole resonators which are designed as self-contained closed looped circuits and which determine the frequency dependent transmission characteristics of the filter circuits and wherein successive four-terminal resonators are interconnected by way of coupling circuits.

2. Description of the Prior Art

Filter circuits of the CTD type are known as, for example, as described in German LP 2,453,669. Other specific embodiments of such circuits are described in German AS 2,534,319 as well as in German AS 2,608,582. In these publications, it is also described how bucket brigade devices and bucket brigade circuits as well as charged coupled devices are understood as to be designated as CTD lines. See also the article entitled "Charge-Coupled Devices" appearing in Wireless World of February 1975 pages 61 through 65 describe signal processing with charge coupled devices.

Charge coupled devices are circuits which operate according to the principle of coupled charges. It is for the two types of circuits, BBD and CCD the designation of "CTD installation", (charge transfer devices) has been adapted in the technical vocabulary and this term also characterizes transmission devices that have unidirectional transmission behaviour. CTD devices consist of an integral number as, for example, n individual CTD elements which can be constructed as integrated overall arrangements. Known CTD arrangements must be operated with clock pulse signals having a specific clock pulse frequency $f_T$ and the clock pulse signal is supplied to the individual charge transfer capacitors of the BBD arrangements or to the transfer capacitances of the CCD lines. In practice, generally multiphase CTD arrangements are preferred wherein the clock pulse signals are phased displaced relative to each other such that adjacent transfer capacitances are operated with phase displaced clock pulses. Consequently, if one utilizes a so-called p-phase clock pulse system ($p=2, 3, 4 \ldots$), then one CTD element consists of p adjacent transfer capacitances. Other technical discussion on these devices is given in the book entitled "Charged Transfer Devices" Academic Press, Inc. New York, San Francisco, London published in 1975.

Filter circuits according to German LP 2,453,669 and German AS 2,534,319, and German AS 2,608,582 utilize as the resonant determining devices self-contained closed looped circuits which are designated in this specification as four-terminal resonators. In German AS 2,534,319 input and output coupling circuits are also illustrated which are designed in the form of lattice filter sections whereby the properties of the CTD arrangements must be considered for the circuit construction. In the case of input and output coupling circuits illustrated in German AS 2,608,582, the $\pi$ section arrangement is utilized.

SUMMARY OF THE INVENTION

In the present invention, filter circuits constructed from CTD devices in the form of closed looped resonators and amplifiers utilize input or output coupling circuits as intermediate couplings so as to form multisection filters in which two or more four-terminal resonators are connected in chain by way of suitable coupling circuits. The ratio of the transfer capacitances of the CTD arrangements utilized in the supply lines relative to the transfer capacitance of the CTD arrangement utilized in the closed looped circuits used in the four-terminal resonators is a co-determining factor of the filter characteristic.

Although the known filter circuits require only relatively small space because they are constructed in integrated circuit technique it is known that particularly for the coupling circuits, many CTD elements are required.

The object of the present invention consists in providing a filter circuit which consists of a plurality of chain connected CTD four-terminal resonators and in which the coupling circuits between the individual four-terminal resonators are as simple as possible so that as small a number as possible of the CTD elements, CTD lines and amplifiers are required.

The object of the invention is obtained due to the fact that amplifiers are connected in parallel with the input and/or the output of the individual four-terminal resonators and the signal flow direction of the amplifiers correspond to that of the parallel connected to CTD line and the series lines of the coupling circuit which connects successive four-terminal resonators have unidirectional transmission characteristics and an inverting amplifier is mounted in at least one of the series lines.

Other objects, features and advantages of the invention will be readily apparent from the following description of certain preferred embodiments thereof taken in conjunction with the accompanying drawings, although variations and modifications may be effected without departing from the spirit and scope of the novel concepts of the disclosure and in which:

DESCRIPTION OF THE PREFERRED EMBODIMENTS

Figure 1:
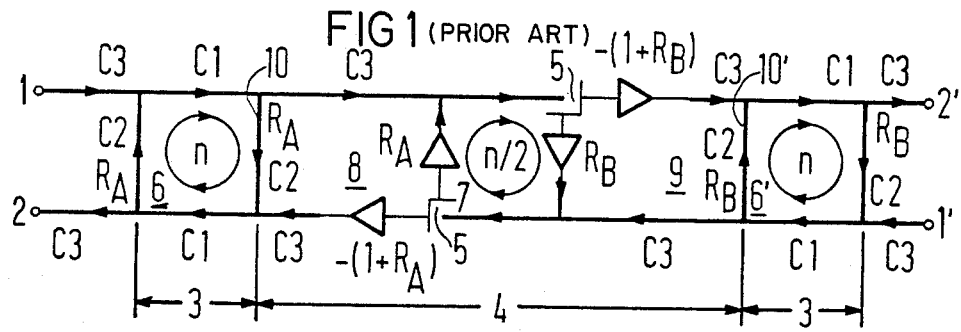
FIG. 1 is a schematic illustration of filter circuits such as described in German LP 2,453,669, German AS 2,534,319 and German AS 2,608,582.

FIG. 1 illustrates a known circuit arrangement as illustrated in German AS 2,608,582. The broad lines represent CTD lines with unidirectional transmission characteristic as indicated by the direction of the arrows in each of the individual line segments. The values of the capacitances of the transfer capacitances C1, C2 and C3 are indicated by the individual CTD line segments. The thin lines in the Figure are galvanic line connections which have unidirectional transmission characteristics determined by the signal flow direction of the amplifiers which are connected in these lines. For example, a two circuit filter is illustrated which has four-terminal resonators 6 and 6' interconnected by way of the coupling circuit. So as to provide a simple illustration, it is assumed that the four-terminal resonators 6 and 6' are of similar construction so that the sections 3, 4 and 3' result with the sections 3 and 3' being similar. Also, an input terminal 1 is illustrated as well as an output terminal 2 and a second output terminal 2' and an additional input terminal 1'. Circuits which are known in the prior art can be series connected to the input or output terminals and such known circuits are suited for converting analog signals into signals suitable for use for CTD lines as well as conversely to reconvert a signal transmitted by CTD lines into an analog signal. Circuits which are useful for this purpose are described in the book entitled "Charged Transfer Devices" on pages 47 through 61. This book has been identified previously in the specification. In the circuit sections 3 and 3', the CTD series lines have transfer capacitances of C1 and the CTD parallel lines have transfer capacitances of C2. The self-contained closed looped circuit 3 and 3' contain the small letter n and this is to indicate that the four terminal resonators 6 and 6' have n CTD elements and the resonant frequency $f_R$ is determined for these closed looped circuits. The coupling circuit 4 consists of a coupling ring 7 to which the circuit section 8 is series connected and the circuit section 8 is connected. In the coupling ring 7, a closed looped circuit results which has n/2 CTD elements. In the series connected line section 8, the CTD line utilized therein has the transfer capacitance of C3 and the following circuit 9 also has the transfer capacitance C3. In the coupling ring 7, there are two switching devices 5 and 5' which represent the so-called powerless output coupling. As an example, such powerless output couplings for CCD circuits may be of the type described on pages 53 through 57 of the book entitled "Charged Transfer Devices" and in an analogous modification can be constructed for BBD circuits if for the purpose of sampling the charging capacitors of such BBD circuits amplifiers are utilized with input resistances which approach infinite impedance. An amplifier having the amplification factor of $R_A$ is mounted in front of the output coupling 5 disclosed in the lower series branch and is connected in parallel to the upper series line. A second amplifier having an amplification factor of $-(1+R_A)$ is connected between the output coupling 5 in the series branch to the output terminal 2.

There is also connected in the output of the upper output coupling 5' an amplifier $R_B$ which has a signal flow direction to the lower series CTD as shown. In addition, an amplifier with the amplification factor of $-(1+R_B)$ is mounted in the upper series line of the circuit section 9 as shown. The following parameters are chosen for the various gain factors and other parameters of the circuit.

$R_A$, $R_B$ = the fraction of the charge in the longitudinal branch of a four-terminal resonator which is conducted into the parallel branch $$(Q \text{ parallel} = R \cdot Q_{series}; R = R_A = R_B = \frac{C2}{C2 + C3} 1; (1 - R) \cdot Q_{series} = \text{transmitted charge})$$

C1, C2, C3—capacitance values of the transfer capacitances at the branching location of the left four-terminal resonator n = CTD-ring element number of the four-terminal resonators n/2 = CTD-element number of the coupling ring 7

$f_R$ = resonant frequency of the four-terminal resonator $(6,6') = k \, f_T/n \, (k = 1, 2 \ldots)$ $f_T$ = clock pulse frequency In the above, $R_A$ and $R_B$ illustrate the division of the charges and also indicate the charge amplification factors and for clarification in the drawings the charge components $R_A$ and $R_B$ are additionally labelled at the various line positions so that the charge component $R_A$ flows in the parallel mounted CTD line 10 of the four-terminal resonator and the charge component $R_B$ flows in the CTD line 10' of the four-terminal resonator 6' with the CTD line 10' being disposed in the parallel branch. It should be noted that the CTD lines 10 and 10' respectively, have opposite unidirectional charge transfer characteristics. As previously discussed in the referenced German patents in AS publications, the design of filter circuits of the present type are analogous to the design of filter circuits in microwave circuits such as described, for example, in the book of Matthaei-Young Jones entitled "Microwave Filters Impedance Matching and Coupling Structures" published by McGray-Hill Book Company Corporation in 1964. This is because CTD lines can also be envisioned as transmission lines which have line characteristics that can be considered in the same manner as microwave filters. For these reasons, the circuit illustrated in FIG. 1 operates as follows.

The circuit has the characteristic of a separating or shunt circuit and the energy fed into the input 1 always appears completely at the output 2' when its signal frequency $f_s$ corresponds to the resonant frequency $f_R$ as defined above. The greater the signal frequency $f_s$ deviates from the resonant frequency the more signal energy will appear at the output 2. If only the input 1 and the output 2 are utilized the circuit has a pass band characteristic.

Figure 2:
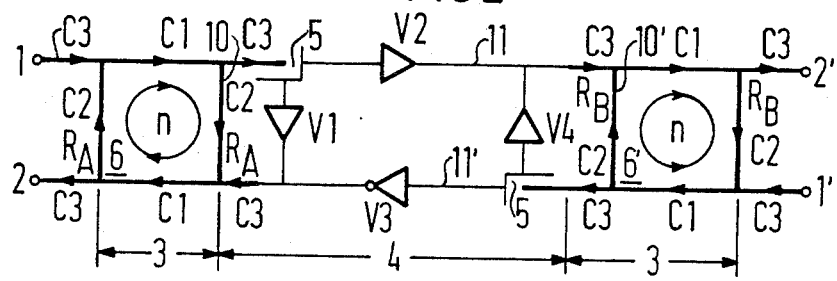
FIG. 2 illustrates the inventive coupling circuit wherein four amplifiers are used.
Figure 3:
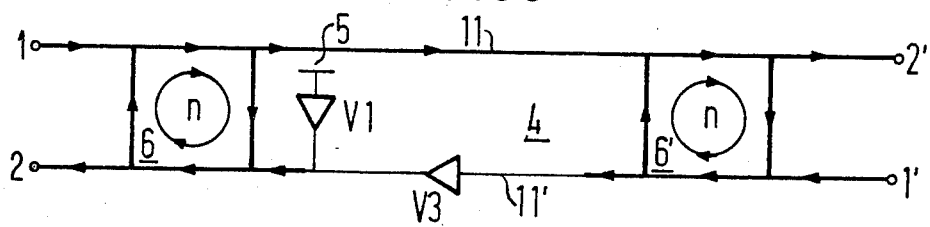
FIG. 3 illustrates an additional embodiment of a coupling circuit in which successive four-terminal resonators are interconnected by way of CTD series lines from which the signals for an amplifier mounted in the parallel branch is directly coupled to the output.
Figure 4:
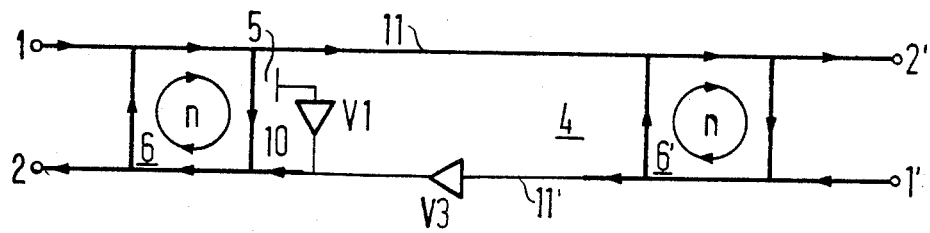
FIG. 4 illustrates an additional circuit in which the signal for the amplifier mounted in the series branch is output coupled from the parallel line branch of the series connected four-terminal resonator.

FIGS. 2 through 4 illustrate circuit structures according to the invention and elements which are similar in their operation and effect to those in FIG. 1 are designated with the same reference numerals and such common elements will not again be described but reference may be made to FIG. 1 description for explanation.

In the circuit of FIG. 2, the coupling circuit 4 which connects the four-terminal resonator 6 and 6' is formed by the use of the amplifiers V1, V2, V3 and V4 connected as shown. In the upper series line between the input 1 and the output 2', a first powerless signal output coupling 5 is mounted. Also, in the lower series line between the input 1' and the output 2 a second powerless coupling 5' is mounted. The signal output couplings 5 and 5' can be mounted directly adjacent to the four-terminal resonators 6 or 6' or their coupling can be connected by way of short CTD line segments.

An amplifier V1 is parallel connected with the CTD line 10 associated with the four-terminal network 6 such that the amplifier V1 is connected to the output of the four-terminal resonator 6. An amplifier V4 is connected in parallel with the CTD line 10'. The corresponding series lines of successive four-terminal resonators are interconnected by way of the lines 11 or 11', respectively, and amplifiers V2 and V3 are mounted in these series lines. Amplifier V2 has a unidirectional transmission characteristic which allows flow from the input 1 to the output 2'. The amplifier V3 has a undirectional transmission characteristic which allows transmission from the input 1' to the output 2. The transmission directions of the amplifiers V1 and V4 must correspond to the unidirectional transmission directions of the parallel disposed CTD lines 10 and 10'. Thus, the amplifier V1 transmits signals from the signal output coupling 5 of the upper series branch to the lower series branch and the amplifier V4 transmits signals from the signal output coupling 5' of the lower longitudinal branch in the direction toward the upper series branch. The amplification factors of the amplifiers V1 through V4 can be as follows:

$$V1 = \frac{R_B(1 + R_A)}{1 + R_A R_B} \qquad V3 = \frac{-1 + R_A}{+1 + R_A R_B}$$

$$V2 = \frac{-1 + R_B}{+1 + R_A R_B} \qquad V4 = \frac{R_A(1 + R_B)}{1 + R_A R_B}$$

V1 through V4 are the charge amplification factors or charge divisions respectively and V2 and V3 which have negative polarity signs can be formed as inverting amplifiers so that the amplifiers V2 and V3 have opposite polarity signs from the amplifiers V1 and V4.

In the circuit arrangement of FIG. 2, it is to be realized that the individual partial segments of the coupling circuit 4 have unidirectional transmission characteristics which is determined by the signal flow direction of the amplifiers V1 through V4.

Additional circuits are illustrated in FIGS. 3 and 4 in which two of the amplifiers of the circuit in FIG. 2 can be eliminated by selecting the amplification factors of the remaining amplifiers. If for example, by selecting transfer capacitances C2 or C3, respectively, the amplifiers V2 or V4, respectively, are selected to have amplification factors of one than these amplifiers can be eliminated from the circuit. So as to assure the unidirectional transmission characteristic in the circuits of FIGS. 3 and 4, the connection line 11 for the purpose of connecting the series branches of the four-terminal resonators 6 and 6' which line is mounted in the upper series branch is constructed as a CTD line which has a transmission direction as shown by the arrow. In the circuit of FIG. 3 the signal output coupling 5 is directly coupled to the CTD line 11 mounted in the series branch. On the other hand, in the circuit of FIG. 4, the signal output coupling 5 is coupled to the parallel disposed CTD line 10 of the four-terminal resonator 6. With regard to the couplings, it should be realized that a charge is output coupled in each instance from the parallel branches which maintains the initially indicated conditions.

Although the examples given are shown as interconnecting in providing two circuit filters the principles described also are valid when multimember filter circuits having individual four-terminal resonators are interconnected with one another by coupling circuits.

Although the invention has been described with respect to preferred embodiments, it is not to be so limited as changes and modifications may be made made therein which are within the full intended scope of the invention as defined by the appended claims.

We claim as our invention:

1. An electrical filter circuit comprising CTD-lines consisting of individual CTD-elements formed as four-terminal resonators, each of which are designed as closed looped circuits, and which determine the frequency-dependent transmission behaviour of the filter circuit, and wherein successive four-terminal resonators are interconnected with a coupling circuit, characterized in that there are parallel-connected, with the input and/or output of the individual four-terminal resonator (6, 6'), amplifiers (V1, V4) which have signal flow directions in a first direction, CTD-lines (10, 10') connected in parallel with said amplifiers (V1, V4) to pass current in said first direction, and that series lines (11, 11') of the coupling circuit (4) which connect successive four-terminal resonators (6, 6') have unidirectional transmission behaviour, and including an inverting amplifier (V3) mounted in at least one of said series lines (e.g. 11'). (FIG. 2).

2. An electrical filter circuit according to claim 1, characterized in that an amplifier (V1) is connected in parallel only with the output of the series connected CTD-four-terminal resonator (6), and one of the series lines (e.g. 11) of the coupling circuit (4) is designed as a CTD-line.

3. An electrical filter circuit according to claim 2, characterized in that the output coupling (5) for the parallel mounted amplifier (V1) is connected from the adjacent CTD-line (10) of the four-terminal resonator (6).

* * * * *